(12) United States Patent
El Yahyaoui et al.

(10) Patent No.: US 8,386,967 B2
(45) Date of Patent: Feb. 26, 2013

(54) SEMICONDUCTOR LAYOUT SCANNING METHOD AND SYSTEM

(75) Inventors: Farid El Yahyaoui, Helmond (NL); Jozefus Godefridus Gerardus Pancratius Van Gisbergen, Hilvarenbeek (NL); Jeroen Pieter Frank Willekens, Eindhoven (NL)

(73) Assignee: Sagantec Israel Ltd., Tirat Careml (IL)

( * ) Notice: Subject to any disclaimer, the term of this patent is extended or adjusted under 35 U.S.C. 154(b) by 258 days.

(21) Appl. No.: 12/593,392

(22) PCT Filed: Mar. 19, 2008

(86) PCT No.: PCT/EP2008/053302
§ 371 (c)(1),
(2), (4) Date: Apr. 1, 2010

(87) PCT Pub. No.: WO2008/116807
PCT Pub. Date: Oct. 2, 2008

(65) Prior Publication Data
US 2010/0185996 A1      Jul. 22, 2010

(30) Foreign Application Priority Data

Mar. 26, 2007 (EP) .................................. 07104863

(51) Int. Cl.
*G06F 17/50* (2006.01)
(52) U.S. Cl. ............................ 716/52; 716/112; 716/135
(58) Field of Classification Search ........................ None
See application file for complete search history.

(56) References Cited

U.S. PATENT DOCUMENTS

| 6,269,472 | B1 * | 7/2001 | Garza et al. ..................... 716/52 |
| 6,587,992 | B2 | 7/2003 | Marple |
| 7,275,227 | B1 * | 9/2007 | Ying .............................. 716/52 |
| 7,389,001 | B2 * | 6/2008 | Messerman et al. .......... 382/284 |
| 2003/0009728 | A1 | 1/2003 | Marple |

OTHER PUBLICATIONS

Lin, S L et al., "Minplex—A Compactor that Minimizes the Bounding Rectangle and Individual Rectangles in a Layout", Design Automation, (Jun. 29, 1986), pp. 123-130.
Kar, P K et al., "TECHMIG: A layout tool for technology migration", VLSI Design, 1999, (Jan. 7, 1999), pp. 615-620.
Fang F et al., "Calligrapher: A New Layout-Migration Engine for Hard Intellectual Property Libraries", IEEE Transactions on Computer Aided Design of IntegratedCircuits and Systems, vol. 24, No. 9, (Sep. 1, 2005), pp. 1347-1361.

(Continued)

*Primary Examiner* — Leigh Garbowski
(74) *Attorney, Agent, or Firm* — Nixon & Vanderhye PC

(57) ABSTRACT

A method for scanning a semiconductor layout, the layout comprising objects with edges and corners, the method comprising identifying locally closest point pairs, identifying a proximity relation between two parallel edges where the parallel edges have at least one locally closest point pair in common and storing the proximity relation in a proximity relations table of a database together with a reference to the corresponding pair of edges. Locally closest point pairs are identified where the first edge and the second edge are not in contact with each other, a distance between the first point and the second point is the shortest distance between the first edge and the second edge, and a convex bounding area with the first point and the second point on its boundary contains no edge.

17 Claims, 11 Drawing Sheets

OTHER PUBLICATIONS

Lin et al, "Minplex—A Compactor that Minimizes the Bounding Rectangle and Individual Rectangles in a Layout", Research Lab of Electronics MIT, 23$^{rd}$ Design Automation Conference, Paper 7.4, Jun. 1986 IEEE, pp. 123-130.

Kar et al, "TECHMIG: A Layout Tool for Technology Migration", 12$^{th}$ International Conference on VLSI Design—Jan. 1999 IEEE, pp. 615-620.

Marple, "A Hierarchy Preserving Hierarchical Compactor," 27$^{th}$ ACM/IEEE Design Automation Conference, 1990, Paper 22.2, pp. 375-381.

Bois et al, "Efficient Generation of Diagonal Constraints for 2-D Mask Compaction," IEEE Transactions on Computer-Aided Design of Integrated Circuits and Systems, vol. 15, No. 9, 1996, pp. 1119-1126.

* cited by examiner

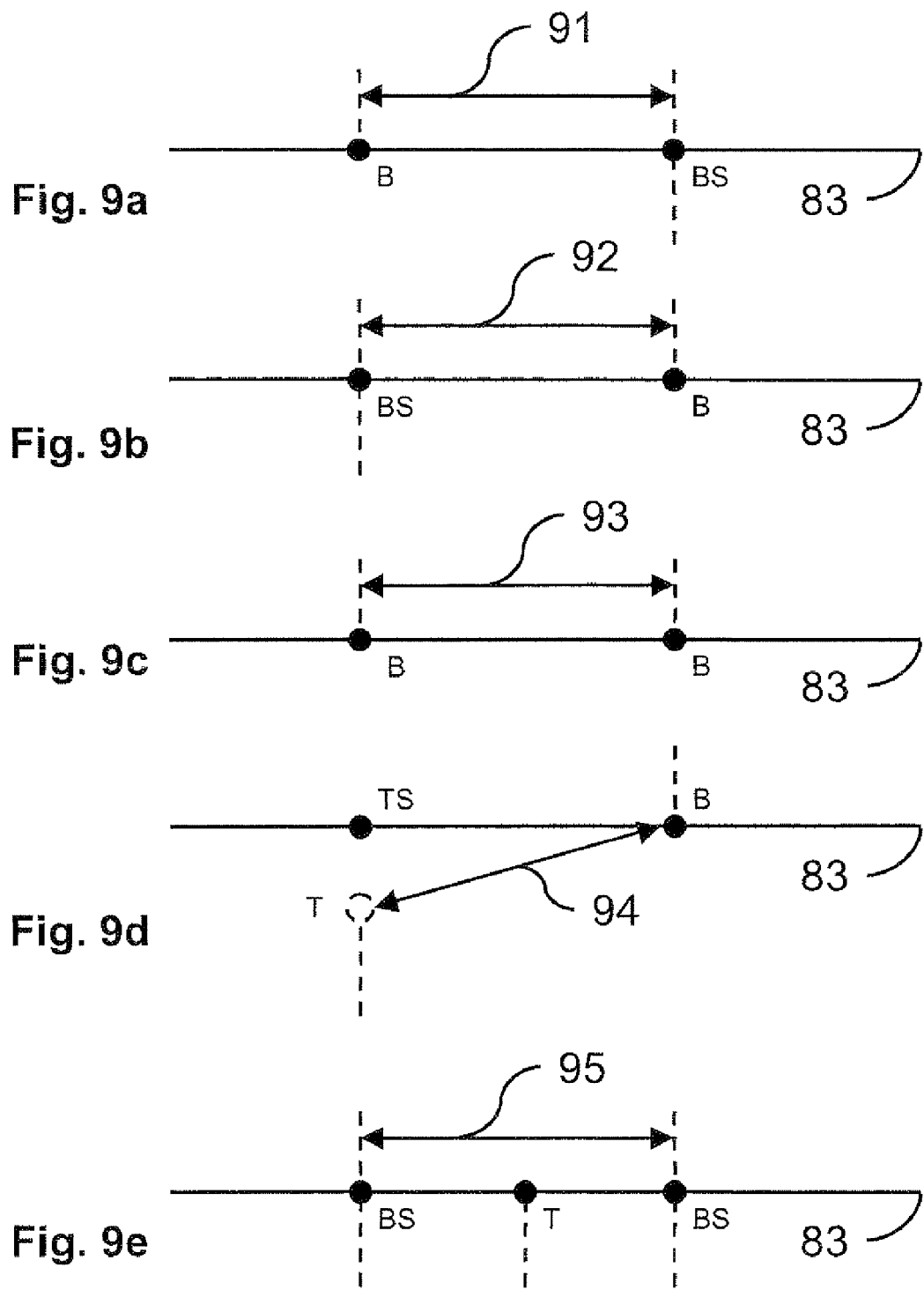

SEMICONDUCTOR LAYOUT SCANNING METHOD AND SYSTEM

This application is the U.S. national phase of International Application No. PCT/EP2008/053302 filed 19 Mar. 2008, which designated the U.S. and claims priority to EP Application No. 07104863.1 filed 26 Mar. 2007, the entire contents of each of which are hereby

TECHNICAL FIELD OF THE INVENTION

The invention relates to a method for scanning a semiconductor layout, the layout comprising objects with edges and corners.

The invention further relates to a computer program product and a system for scanning a semiconductor layout and to a method for producing an integrated circuit.

BACKGROUND OF THE INVENTION

Scanning of semiconductor layouts is used in layout processing or modification systems that migrate a layout to another technology, systems that make the layout smaller or systems that try to fix violations of constraints in these layouts. A layout migration system tries to calculate a new layout, based on an input layout, such that the new layout fulfills the design rules or constraints of the new production process for the semiconductor device. Layout compaction systems try to optimize a design or layout for area. The footprint of the layout has to become smaller and a compaction engine can do this such that the original design intent is still in the new layout and such that no design rule violations appear.

A two dimensional compaction system is known from U.S. Pat. No. 6,587,992. In the system according to that US patent, position variables of edges and corner points of layout elements are determined and a system of constraints is constructed. The constraints describe minimum distances between edges and corners of two layout elements in the terms of position variables. Some constraints are one dimensional (e.g. $x_2-x_1>d$) other constraints are two-dimensional (e.g. $(x_2-x_1)^2+(y_2-x_1)^2>d^2$). An objective function is established that must be optimized for the two dimensional compaction. The system of constraints is solved to compact and optimize the layout in two dimensions simultaneously. Due to the non-linear two-dimensional constraints, the system of constraints is very difficult to solve in a reasonable runtime. Therefore the non-linear constraints are represented by linear constraints (e.g. $(x_2-x_1)+(y_2-y_1)>d\sqrt{2}$).

It is a problem of known systems that, in a layout with n elements, moving freedom in 2 dimensions results in $n^2$ constraints. In theory every object can move close to every other object and therefore one has to constraint every object to every other object. For larger layouts, the number of constraints will severely increase the time needed for solving the system of constraints.

SUMMARY OF THE INVENTION

It is an object of the current invention to provide a method for scanning a semiconductor layout, which method reduces the number of constraints. This object is achieved by providing a scanning method in accordance with the opening paragraph, which method further comprises:

identifying locally closest point pairs comprising a first point on a first edge and a second point on a second edge, where the first edge and the second edge are not in contact with each other, a distance between the first point and the second point is the shortest distance between the first edge and the second edge, and a convex bounding area with the first point and the second point on its boundary contains no edge, identifying a proximity relation between two parallel edges where the parallel edges have at least one locally closest point pair in common, and storing the proximity relation in a proximity relations table of a database together with a reference to the corresponding pair of edges.

The scanning mechanism according to the invention scans the objects of the layout. The objects may be polygons or paths. The scanning mechanism identifies, in a two dimensional environment, proximity relations between neighboring object edges and between neighboring corners. Where a proximity relation is found, the corresponding edges or corners are neighbors. The proximity relations are found by searching for edges that have a locally closest point pair in common. Locally closest point pairs show where the interaction between two objects or edges is the most significant. The interaction is the most significant in the places where edges are close together and no other objects are in between. The stored proximities, together with the corresponding edges and corners, are determined by the layout configuration or topology of the semiconductor design layout. The database provides excellent opportunities for layout analysis. The stored proximity information also enables fast search and look up of locations in the layout where a modification is possible or required. Because proximity relations are only identified between direct neighbors, the number of relations is kept relatively small and linear with the number of objects. The proximity based layout compaction or design modification that may be performed after the scanning takes far less computational power than the known methods of the prior art. The method for scanning a semiconductor layout according to the invention is suitable for use in a method for designing and/or producing integrated circuits.

In an embodiment, the method further comprises identifying a proximity relation between two corners of non-parallel edges where the two corners share a locally closest point pair and storing the proximity relation in the proximity relations table together with a reference to the corresponding pair of corners.

In this embodiment, proximity relations between two objects diagonally opposing each other are also stored. Depending on the operations to be performed with the proximity information, these additional proximity relations may, or may not be useful. No proximity relations have to be stored between corners of parallel edges, because parallel edges already have a proximity relation according to the basic embodiment described above.

In a preferred embodiment, the method further comprises identifying a proximity relation between an edge and a corner of an edge not parallel to the first mentioned edge where the edge and the corner share a locally closest point pair and storing the proximity relation in the proximity relations table together with a reference to the corresponding corner and edge.

It is an advantage of this embodiment, that it also identifies proximity relations in layouts with non-parallel and non-orthogonal edges. For example, edges under an angle of 45° are often used in semiconductor layouts. Such edges may share a locally closest point pair with a corner of another edge.

In a further embodiment, the convex bounding area is a rectangle containing the complete edges of the pair, the method further comprising storing the relation in the database as an extended proximity relation together with a reference to the corresponding pair of edges. Extended proximity relations may also be identified between two corners when the convex bounding area is a rectangle containing the complete edges of the pair and the rectangle does not contain any other corner or edge. Also an even stricter criterion may be employed for identifying extended proximity relations between two corners. The stricter criterion may require that the convex bounding area is a rectangle containing for each one of the two corners at least one complete edge connected to the respective corner, and said rectangle does not contain any other corner or edge.

Extended proximity relations are identified using large bounding boxes comprising full edges instead of only parts of edges or corners only. The larger bounding boxes of the extended proximity relations also include a smaller bounding box. An extended proximity relation is a subspecies of a proximity relation. When considering extended proximity relations instead of 'normal' proximity relations, the number of constraints s further decreased. It depends on the application the proximity relations are used for, whether the further reduction of the number of constraints is an advantage (easier computations) or a disadvantage (less information about the layout).

In an embodiment, the method further comprises a step of generating a trigger based on the stored proximity relation and the corresponding pair edges, the trigger defining a limit for the relative positions of the corresponding edges beyond which limit a topology of the semiconductor design layout is altered.

As long as the topology (which object is left of which other object, which one is below, etc.) of the layout is not altered, the proximity relations provide sufficient information about the semiconductor design layout. If the proximity information is only used for layout analysis no additional information is needed. The topology of the layout changes when the application executes some layout changing actions. A trigger defines a limit for a layout change beyond which limit the corresponding proximity becomes invalid and the topology is changed. The trigger is derived on basis of the stored proximities and the relative positions of the corresponding edges and corners. The trigger may be used for preventing topology changes and for defining the limits within which the topology remains valid.

In an advanced embodiment, together with the proximity relation, a proximity type of the proximity relation is stored. According to the invention, the proximity relations may also define, e.g., spaces, widths, overlaps or extend situations.

According to a second aspect of the invention, a computer program product is provided for scanning a semiconductor design layout, which program is operative to cause a processor to perform the method according to the invention.

According to a third aspect of the invention, a system is provided suitable for scanning a semiconductor design layout by carrying out the method according to the invention.

These and other aspects of the invention are apparent from and will be elucidated with reference to the embodiments described hereinafter.

BRIEF DESCRIPTION OF THE DRAWINGS

In the drawings:

FIG. 9a-9e illustrates how proximity relations are derived from scanning results.

DETAILED DESCRIPTION OF THE INVENTION

Figure 1:
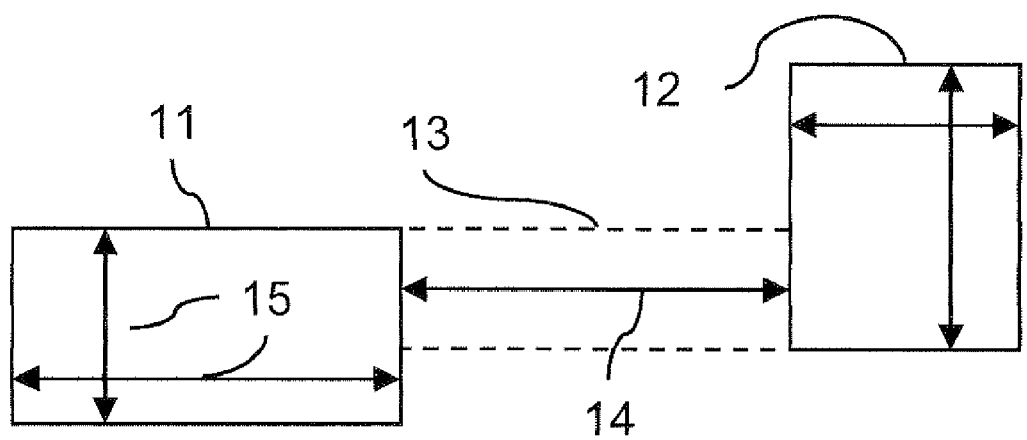
FIG. 1 shows a proximity relation between parallel edges of two polygons.

FIG. 1 shows a proximity relation 14 between parallel edges of two polygons 11, 12. The polygons 11, 12 represent an area on the semiconductor layout with a particular material, structure or functional element. The two polygons 11, 12 have parallel edges, facing each other. A convex bounding area 13 is drawn, comprising the parallel parts of the edges. A proximity relation 14 between the two polygons is identified, because the convex bounding area 13 is empty, i.e. does not contain any other corner or edge. This proximity relation 14 represents the space between the two neighboring polygons 11, 12. In this example and in the examples following hereinafter, the convex bounding area 13 is a rectangle comprising at least parts of the edges or corners involved in the proximity relation 14. It is however to be noted that, depending of the application, other shapes may be equally or more appropriate for the convex bounding area. The convex bounding area may, for example, be triangular, circular, oval or elliptical.

Proximity relations 15 do also exist within the polygons 11, 12. Such proximity relations 15 are identified between two parallel edges of the same polygon 11,12 and represent a width of the polygon 11, 12. The bounding box rectangles of such proximity relations 15 coincide with the polygons 11, 12.

Figure 2:
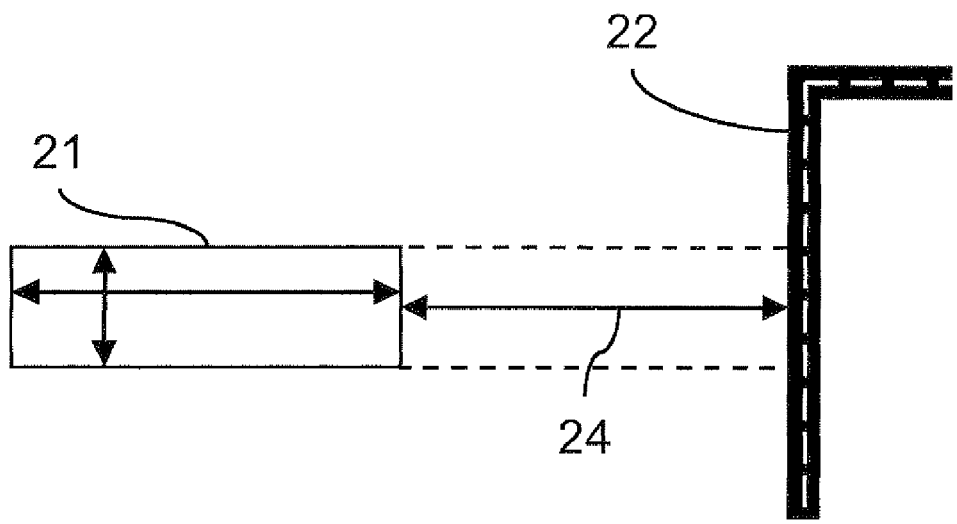
FIG. 2 shows a proximity relation between a polygon edge and a parallel path.

FIG. 2 shows a proximity relation 24 between an edge of a polygon 21 and a path 22 parallel to the polygon 21.

Figure 3A:
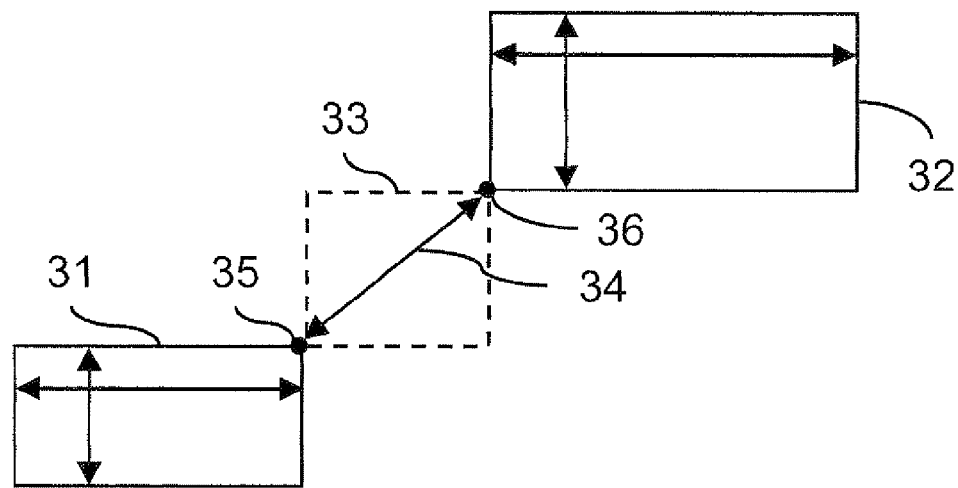
FIG. 3a shows a proximity relation between corners of two polygons.

FIG. 3a shows a proximity relation 34 between corners 35, 36 of two polygons 31, 32. A bounding box rectangle 33 is shown, comprising both corners 35, 36. Because the bounding box rectangle 33 does not comprise any other corner or edge, a proximity relation 34 is identified between the corners 35, 36. In FIG. 3a a rectangular bounding box 33 is shown, but other types of convex bounding areas, such as circles, ellipses, triangles, pentagons or other polygons, may alternatively be used.

Figure 3B:
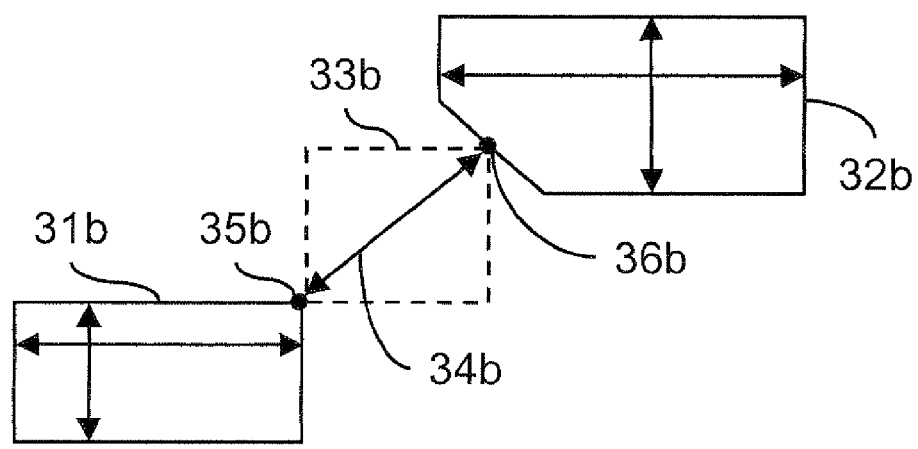
FIG. 3b shows a proximity relation between a corner of a polygon and an edge of another polygon.

FIG. 3b shows a proximity relation 34b between a corner 35b of a first polygon 31b and an edge 36b of a second polygon 32b. The edge 36b of the second polygon 32b makes an angle of approximately 45° with the other edges of the polygon 32b. A bounding box rectangle 33b is shown, comprising both corners 35b, 36b. Because the bounding box rectangle 33b does not comprise any other corner or edge, a proximity relation 34b is identified between the corners 35b, 36b.

Figure 4:
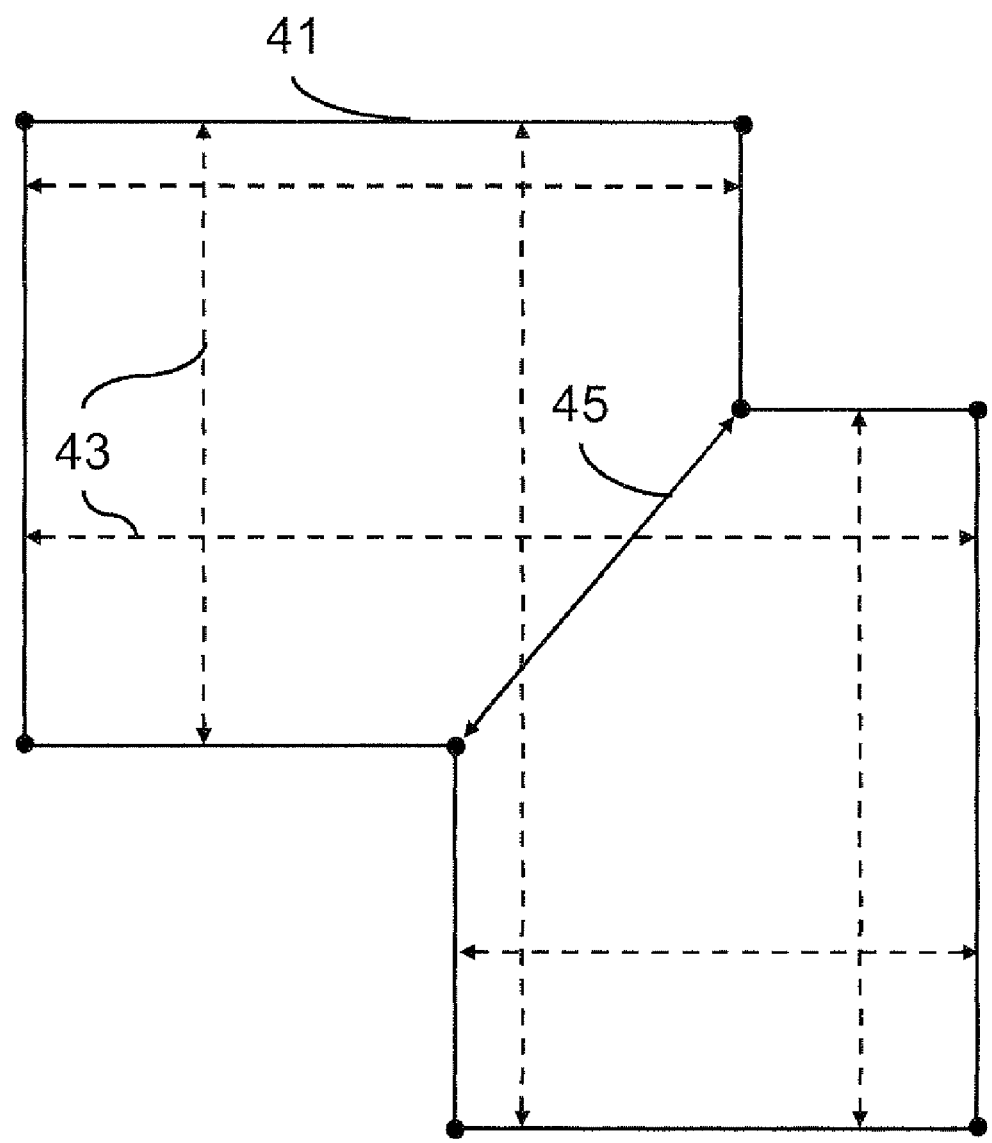
FIG. 4 shows proximity relations within a complex polygon.

FIG. 4 shows proximity relations 43, 45 within a complex polygon 41. The proximity relations 43 between edges of the polygon 41 are indicated by dotted arrows. The proximity relations 45 between corners of the polygon 41 are indicated by solid arrows. For some applications it may not be necessary to describe the topology of the layout using all proximity relations 43, 45 that can be identified. In special circumstances, the amount of stored proximity relations may be limited using selection algorithms or additional criteria for identifying the required proximity relations.

Figure 5:
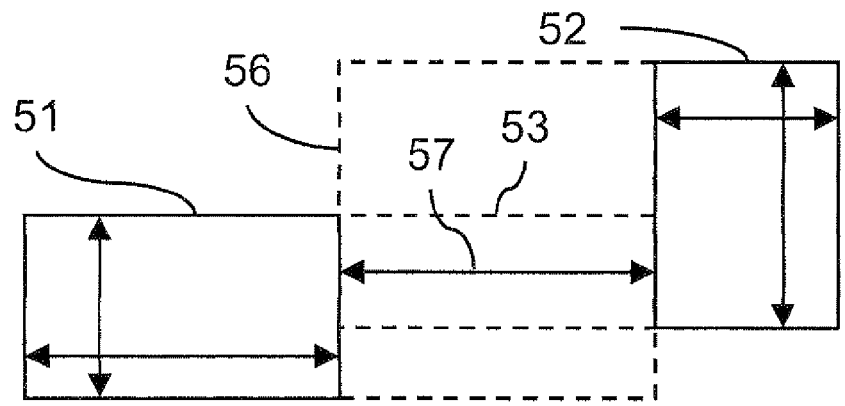
FIG. 5 shows an empty extended bounding box between parallel edges of two polygons.

An additional requirement that may limit the amount of proximity relations stored is illustrated in FIG. 5. FIG. 5 shows an empty extended bounding box rectangle 56 between parallel edges of two polygons 51, 52. The extended bounding box rectangle 56 is obtained by extending the bounding box rectangle 53 along the parallel edges comprised in the bounding box rectangle 53. The extended bounding box rectangle 56 comprises complete edges of the polygons 51, 52. Because the extended bounding box rectangle 56 does not contain any other corner or edge, the proximity relation 57 is additionally considered to be an extended proximity relation. For some applications it may be preferable to only consider extended proximity relations, instead of all proximity relations.

Figure 6:
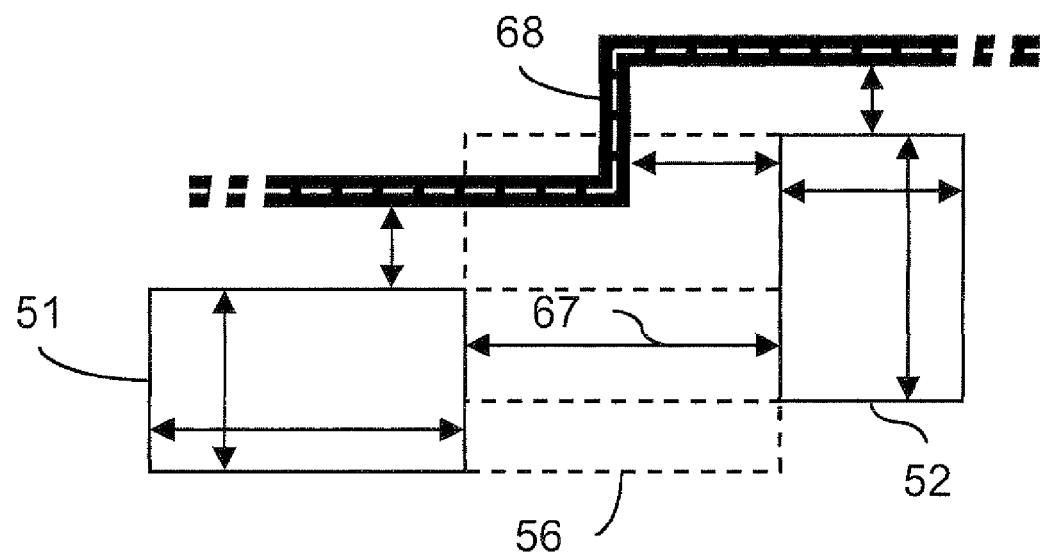
FIG. 6 shows an occupied extended bounding box between parallel edges of two polygons.

FIG. 6 shows the same polygons 51, 52 as shown in FIG. 5, together with a path 68. The polygons may, for example, represent semiconductor structures and the path may represent a wire for interconnecting two or more semiconductor structures. In FIG. 6, the path 68 runs through the extended bounding box 56. Consequently, the proximity relation 67 between the edges of the two polygons 51, 52 is not considered an extended proximity relation.

Figure 7:
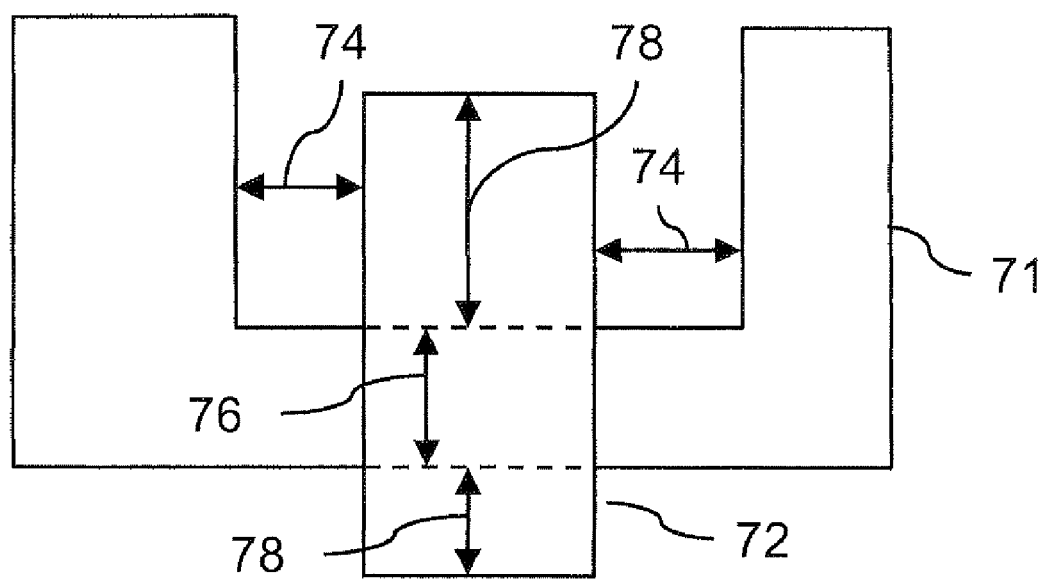
FIG. 7 shows proximity relations relating to overlapping polygons, FIG. 8a-8b schematically shows a method of scanning a layout.

FIG. 7 shows proximity relations 74, 76, 78 relating to overlapping polygons 71, 72. Semiconductor layouts generally comprise several interacting layers with structures of semiconductor material. The rectangular polygon 72 is situated one layer above the U-shaped polygon 71. The polygons 71, 72 partially overlap. In figure 6 several proximity relations are identified. Two proximity relations 74 correspond to the free space between the long edges of the rectangular polygon 72 and the parallel edges at the inside of the U-shaped polygon 71. Another proximity relation 76 corresponds to the overlap of the two polygons. The rectangular polygon 72 extends over two edges of the U-shaped polygon 71 which results in two proximity relations 78.

Figure 8A:
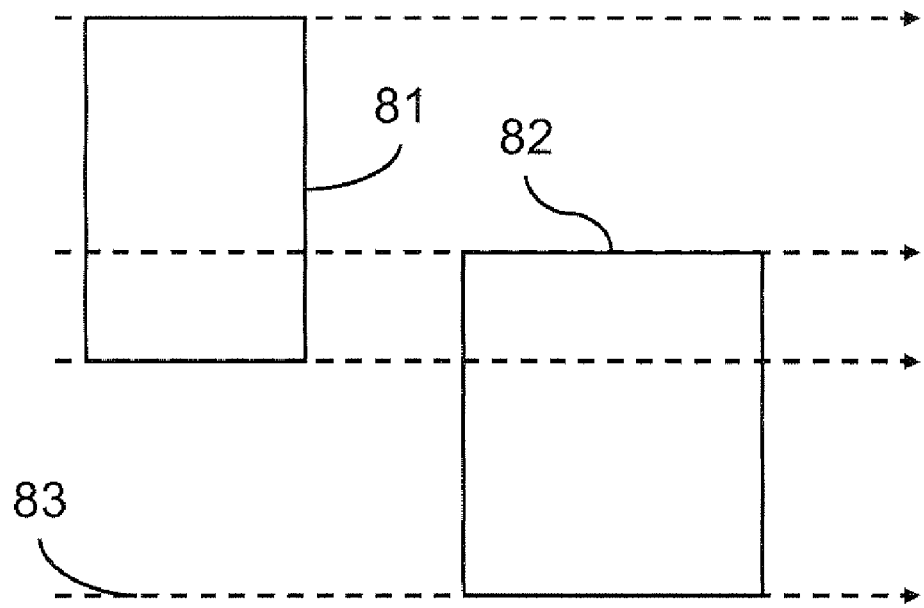
Figure 8B:
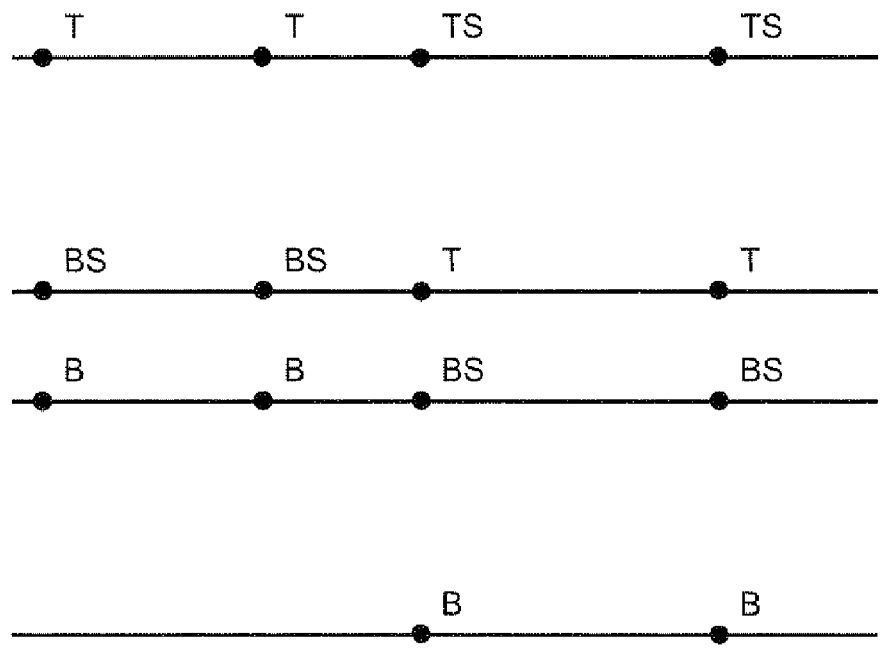

FIG. 8 schematically shows a method of scanning a layout for identifying proximity relations. In FIG. 8a, the layout is shown. The layout comprises two polygons 81, 82. The position of the polygons 81, 82 is known. Based on the information about the positions of the polygons 81, 82, the proximity relations are identified using the following scanning process. Scanning of the layout is performed by moving a scanline 83 from a first side of the layout to a second side of the layout and stopping the scanline 83 when the scanline 83 arrives at a corner of one of the polygons 81, 82. In this example the scanline 83 is moved from the bottom of the layout to the top. When the scanline 83 stops information about all corner points on the scanline 83 is stored in a memory (see FIG. 8b). The detected corner points are called events. At the first stop, two events are detected. The two lower corners of polygon 82 are stored as bottom events (B), because these corners are the first corners that are detected while moving the scanline 83 form bottom top. At the next stop, polygon 81 causes two bottom events (B). The bottom events (B) of the previous scanline have not yet been followed by top events (T) at the same horizontal position. Therefore, bottom shadow events (BS) are stored at the horizontal positions of the bottom corners of polygon 82. The third stop of the scanline 83 causes two bottom shadow events (BS) for polygon 81 and two top events (T) for polygon 82. The top events mark the end of the polygon 82. At the fourth stop, the top corners of polygon 81 cause two top events (T) and two shadow top events (TS) are detected at the horizontal positions of the corners of polygon 82.

Each time the scanline 83 stops, the various events are not only detected, but also the relative positions of the detected events are analyzed for detecting proximity relations. FIG. 9 illustrates how proximity relations are derived from the scanning results. If on a scanline 83, a bottom shadow event (BS) is found at the right side of a bottom event (B), like in FIG. 9a, then a proximity relation 91 is identified between the parallel edges, connected to the corners. In a similar way, a proximity relation 92, 93 is identified if a BS is situated at the left side of a B (FIG. 9b), or when two bottom events (B) are situated next to each other (FIG. 9c). FIG. 9d shows a situation wherein a proximity relation 94 between two corners is identified. In FIG. 9d the scanline 83 comprises a TS with a B at its right side. In such a situation, a proximity relation 94 is defined between the bottom corner and the top corner, relating to the B and the TS respectively. A further possible situation is shown in FIG. 9e. In this situation, a top event is situated between two parallel edges. On the scanline 83, a combination of a BS, a T and a BS is found. Below the scanline 83, both edges are direct neighbors of the path. Proximity relations between the edges and the path have already been identified when the scanline 83 was situated lower in the layout. Above the scanline 83, the two parallel edges are direct neighbors of each other. Therefore, a proximity relation 95 is identified between the two parallel edges.

when the scanline has moved all the way from bottom to top of the layout, the scanning process is repeated with the scanline moving from left to right. Of course the scanning may alternatively be performed from top to bottom and/or from right to left. When using only the rules for identifying proximity relations that are shown in FIG. 9, no diagonal proximity relations are defined between corners of edges that also share a horizontal or vertical proximity relation. As a result, the number of proximity relations is kept relatively low, which results in, e.g., faster compaction algorithms.

Figure 10:
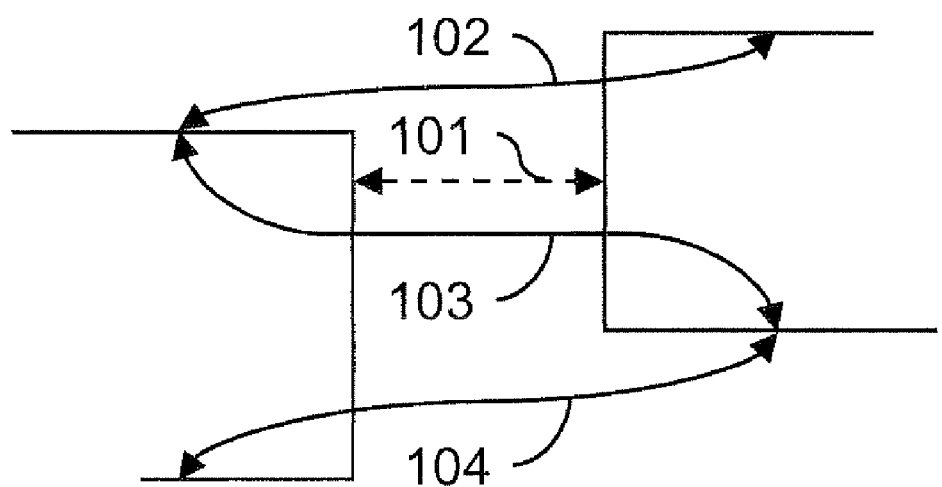
FIG. 10 shows some triggers that are related to proximity relations.

FIG. 10 shows some triggers that are related to a proximity relation 101. In FIG. 10, three triggers 102, 103, 104 are defined for a proximity relation 101 between two parallel edges. Triggers are preferably only generated in layout changing applications, like compaction. In applications that only involve layout analysis, no triggers are needed. The triggers are generated by a trigger finding algorithm that goes through the list of stored proximities. Based on the relative positions of the coordinates of the corners of the edges related to the proximity relation 101, three triggers 102, 103, 104 are defined. The triggers define the layout changes that are possible without affecting the topology of the layout. A first trigger 102 tells that, as soon as the upper edge of the right polygon has a lower position than the upper edge of the left polygon, the topology of the layout changes, which may result in new as well as disappearing proximity relations. Similarly, other triggers 103 and 104 are relevant for other relations between edges. When, for example, the upper edge of the left polygon has a lower position than the lower edge of the right polygon, trigger 103 is triggered, proximity relation 101 disappears and a new proximity relation between two corners is created. Triggers 102, 103, 104 thus define the limits of changes that may be applied to the layout, without needing to repeat the scanning of the layout for defining its proximity relations.

Figure 11:
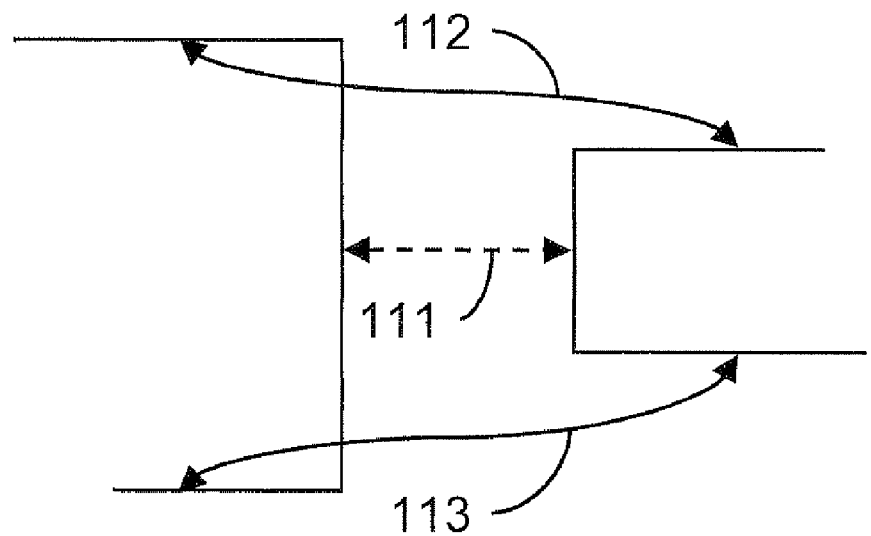
FIGS. 11 and 12 show some triggers that are related to proximity relations.
Figure 12:
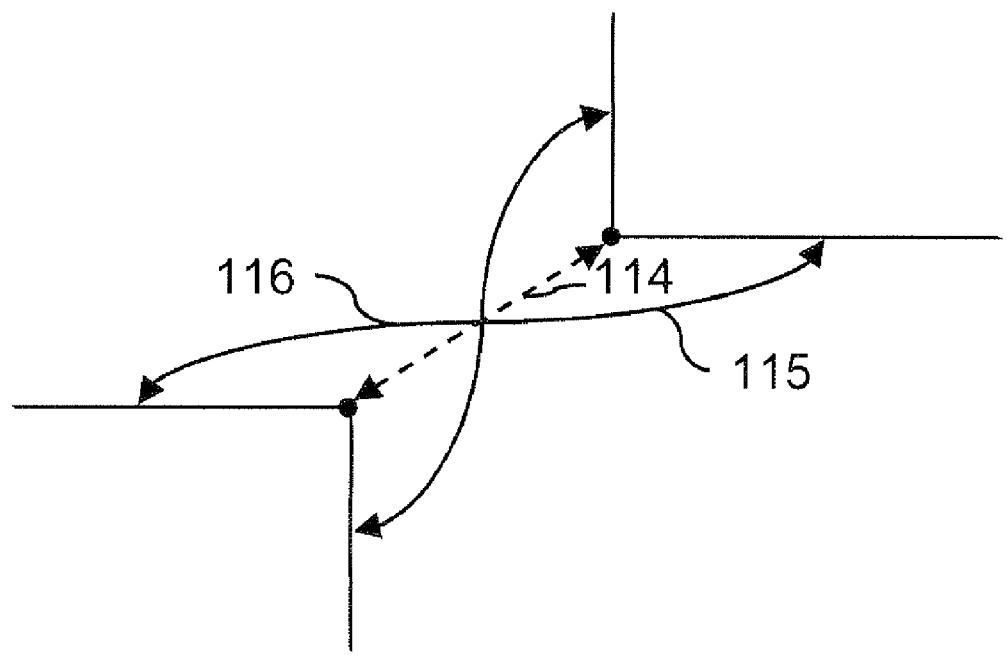

FIG. 11 also shows some triggers that are related to a proximity relation 111. In this event, only two triggers 112, 113 are needed to define the limits between which layout changes do not cause topology changes. In FIG. 12, two triggers 115, 116 are shown for a proximity relation 114 between two corners.

Figure 13:
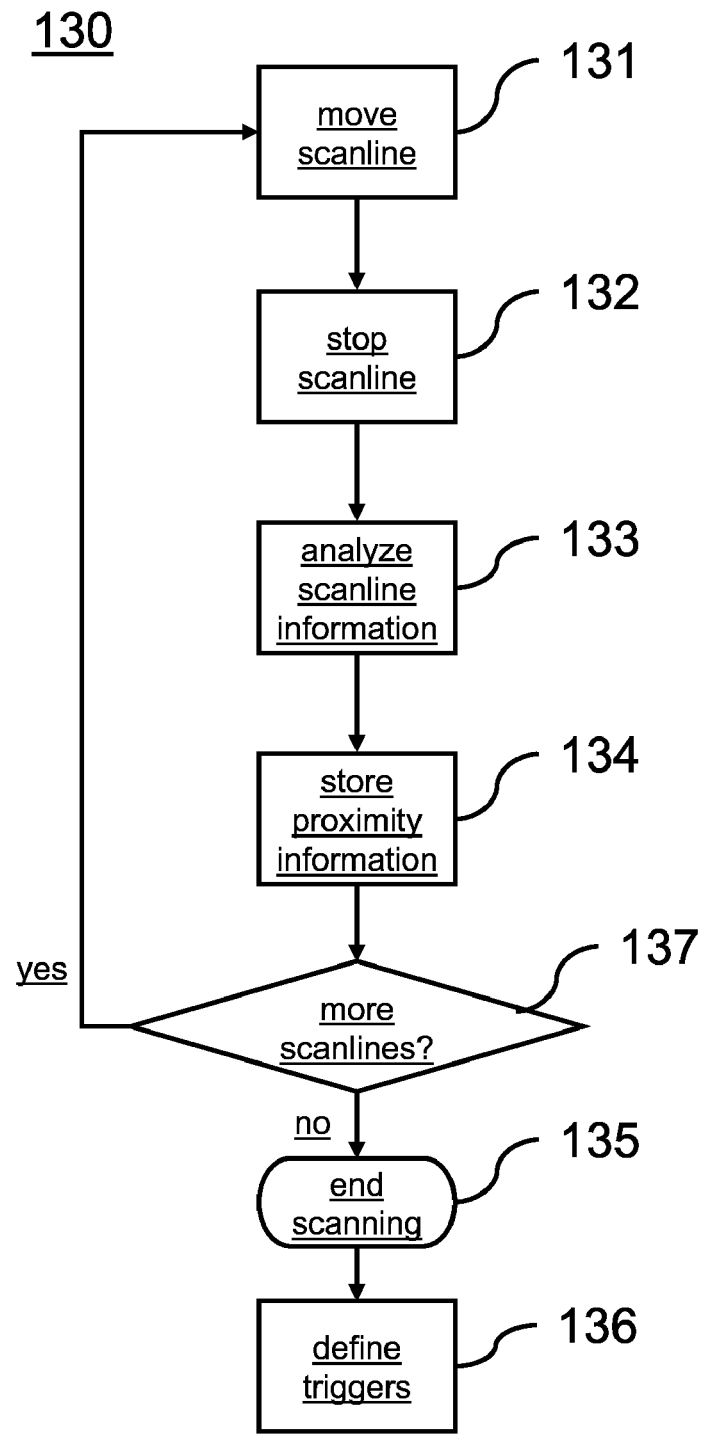
FIG. 13 shows a flow diagram of a method according to the invention.

FIG. 13 shows a flow diagram of a method 130 according to the invention. The method 130 uses a scanline for scanning the layout. The scanline is moved from a first side of the layout to a second side, e.g., from bottom to top. The moving is performed stepwise. At each step, some analysis is performed for identifying the proximity relations. The following steps are shown in FIG. 13:

Stepwise moving 131 of the scanline in a first direction from a first side of the layout to a second side of the layout. In this example, the scanline moves from bottom to top.

As soon as the scanline is at a position where it falls on one or more corners of one of the objects of the layout, the scanline is stopped 132.

Then information is stored 133 about objects on the scanline. The information to store depends on the information already stored on the scanline. If at a particular horizontal coordinate of the scanline, a bottom event (B) or a bottom shadow event (BS) was already stored and no corner is detected at that particular horizontal coordinate, then a bottom shadow event (BS) is stored at the scanline. If a bottom event (B) or a bottom shadow event (BS) was already stored and the scanline does comprise a corner, then a top event (T) is stored. Similarly top events (T) and top shadow events (TS) are followed by top shadow events (TS) or bottom events (B).

In an analysis step 133 the information on the scanline is analyzed for detecting proximity relations.

If a proximity relation is detected, the proximity relation is stored in a database together with the corresponding corner or edge in storage step 134. Additional information may be stored together with the proximity relation. Such additional information may, e.g., include, the type of proximity relation or information about the corners or edges, such as the position in the layout or the materials of the objects of the edges or corners.

After that, if it is determined 137 that another scanline is to be analyzed, the method returns to moving step 131 for analyzing the next scanline. These steps are performed repeatedly until the scanline reaches the second side and all proximity relations are stored in the database. Afterwards, the method is preferably repeated in another direction (horizontal) for obtaining a complete overview of all proximity relations in the layout. If the complete layout is scanned, the scanning method ends 135. After scanning the layout, triggers may be defined for the identified proximity relations in trigger definition step 136.

Figure 14:
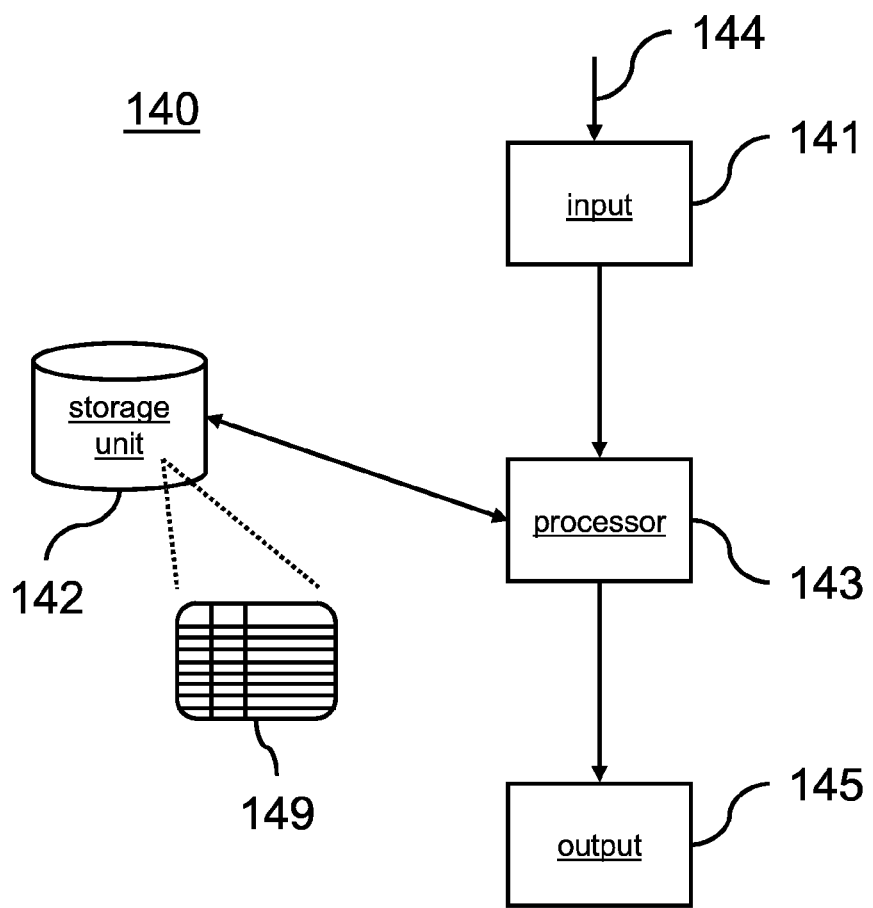
FIG. 14 shows a block diagram of a system 140 according to the invention.

FIG. 14 shows a block diagram of a system 140 according to the invention. The system 140 comprises an input 141 for receiving the layout 144. The input 141 may be a keyboard, a network adapter for receiving the layout 144 from another computer, possibly via the Internet, a CD or DVD-drive or any other means capable of providing data to a computer system. The layout 144 may already be stored on the storage unit 142 of the system 140. The system also comprises a storage unit 142, e.g., a hard disk. The storage unit 142 may be remotely connected via a network. The storage unit 142 is used for storing the layout or a copy of the layout and the proximity database with the proximity relation table 149. The system 140 comprises a processor 143 being arranged for performing the method according to the invention. The processor 143 provides for storing received information on the storage unit, analyzing the information and storing the results of the analysis on the storage unit 142. Preferably, the system 140 also comprises output means 145 for showing the results of the analysis to a user or printing results on paper.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. Use of the verb "comprise" and its conjugations does not exclude the presence of elements or steps other than those stated in a claim. The article "a" or "an" preceding an element does not exclude the presence of a plurality of such elements. The invention may be implemented by means of hardware comprising several distinct elements, and by means of a suitably programmed computer. In the claims enumerating several means, several of these means may be embodied by one and the same item of hardware. The mere fact that certain measures are recited in mutually different dependent claims does not indicate that a combination of these measures cannot be used to advantage.

The invention claimed is:

1. A method for scanning a semiconductor layout, the layout comprising objects with edges and corners, the method comprising:
    finding a pair of edges of the objects, where:
        a first edge and a second edge of the pair are not in contact with each other,
        the first edge and the second edge comprise a locally closest point pair comprising a first point on the first edge and a second point on the second edge, where a distance between the first point and the second point is the shortest distance between the first edge and the second edge,
        a convex area exists whose intersection with the objects consists only of a portion of the first edge and a portion of the second edge, thereby significantly reducing the number of edge pairs that will be found, and
    creating a proximity relation between the first edge and the second edge, the proximity relation being created only between directly neighboring edges and/or corners and the proximity relation being determined by the layout topology, and
    storing the proximity relation in a proximity relations table of a database together with a reference to the corresponding pair of edges.

2. A method for scanning a semiconductor design layout as claimed in claim 1, further comprising:
    finding a pair of corners comprising a first corner and a second corner of non-parallel edges where:
        the non-parallel edges are not in contact with each other,
        the first corner and the second corner share a locally closest point pair,
        a convex area exists whose intersection with the objects consists only of the first corner and the second corner, thereby significantly reducing the number of edge pairs that will be found,
    creating a proximity relation between the first corner and the second corner, and
    storing the proximity relation in the proximity relations table together with a reference to the corresponding pair of corners.

3. A method for scanning a semiconductor design layout as claimed in claim 2, wherein the convex area is a rectangle and the intersection of the convex are with objects contains for each one of the first corner and the second corner at least one complete edge connected to the respective corner, the method further comprising storing the proximity relation in the database as an extended proximity relation together with a reference to the corresponding pair of corners.

4. A method for scanning a semiconductor design layout as claimed in claim 2, wherein the convex area comprises two rectangles, together containing the two corners and two complete edges connected to each of the two corners, the method further comprising storing the proximity relation in the database as an extended proximity relation together with a reference to the corresponding pair of corners.

5. A method for scanning a semiconductor design layout as claimed in claim 2, further comprising generating a trigger based on the stored proximity relation and the corresponding pair of corners, the trigger defining a limit for the relative positions of the corresponding corners beyond which limit a topology of the semiconductor design layout is altered.

6. A method for scanning a semiconductor design layout as claimed in claim 1, further comprising:
finding a third edge and a third corner of a fourth edge not parallel to the third edge where:
the third edge and the fourth edge are not in contact with each other,
the third edge and the third corner share a locally closest point pair, and
a convex area exists whose intersection with the objects consists only of a portion of the third edge and the third corner, thereby significantly reducing the number of edge —corner pairs that will be found,
creating a proximity relation between the third edge and the third corner,
storing the proximity relation in the proximity relations table together with a reference to the third corner and the third edge.

7. A method for scanning semiconductor design layout as claimed in claim 1, wherein the convex area is a rectangle.

8. A method for scanning a semiconductor design layout as claimed in claim 1, wherein the convex area is a rectangle and the intersection of the convex area with objects contains the complete first edge and the complete second edges, the method further comprising storing the relation in the database as an extended proximity relation together with a reference to the corresponding pair of edges.

9. A method for scanning a semiconductor design layout as claimed in claim 8 wherein the storing comprises storing the extended proximity relation in an extended proximity relations table of the database.

10. A method for scanning a semiconductor design layout as claimed in claim 1, further comprising generating a trigger based on the stored proximity relation and the corresponding pair of edges, the trigger defining a limit for the relative positions of the corresponding edges beyond which limit a topology of the semiconductor design layout is altered.

11. A method for scanning a semiconductor design layout as claimed in claim 10, further comprising a step of storing the trigger in the proximity relations table together with the corresponding proximity relation.

12. A method for scanning a semiconductor design layout as claimed in claim 1, further comprising storing the edges and the corners in a layout table of the database together with the corresponding proximity relations.

13. A method for scanning a semiconductor design layout as claimed in claim 1, further comprising storing, together with the proximity relation, a proximity type of the proximity relation.

14. A method for scanning a semiconductor design layout as claimed in claim 13, wherein the proximity type is one of the group space, width, overlap or extend situation.

15. A method for scanning a semiconductor design layout as claimed in claim 1, the method comprising the following steps:
moving a scanline in a first direction from a first side of the layout to a second side of the layout
stopping the scanline when the scanline arrives at a corner of one of the objects,
storing information about objects on the scanline,
analyzing the information on the scanline for identifying the proximity relation, corresponding to the corner or to an edge comprising the corner,
storing the proximity relation in a database together with the corresponding corner or edge
repeatedly performing the steps of moving, stopping, analyzing and storing until the scanline reaches the second side.

16. The method for scanning a semiconductor design layout as claimed in claim 15, further comprising moving a second scanline in a second direction perpendicular to the first direction, from a third side of the layout to a fourth side of the layout, and performing the steps of moving, stopping, analyzing, storing and repeatedly performing until the scanline reaches the fourth side.

17. A system for scanning a semiconductor design layout, the layout comprising objects of semiconductor material with corners and edges, the system comprising:
an input for receiving the layout,
a storage unit for storing the layout and for storing a proximity database, and
a processor being arranged for
finding a pair of edges of the objects, where
i. a first edge and a second edge of the pair are not in contact with each other,
ii. the first edge and the second edge comprise a locally closest point pair comprising a first point on the first edge and a second point on the second edge, where a distance between the first point and the second point is the shortest distance between the first edge and the second edge,
iii. a convex area exists whose intersection with the objects consists only of a portion of the first edge and a portion of the second edge thereby significantly reducing the number of edge pairs that will be found,
creating a proximity relation between the first edge and the second edge, the proximity relation being created only between directly neighboring edges and/or corners and the proximity relation being determined by the layout topology, and
storing the proximity relation in a proximity relations table of a database together with a reference to the corresponding pair of edges.

* * * * *